350-442

OR 4,103,989

United States

Rosin 4,103,989

Aug. 1, 1978

[54] UNIT-POWER CONCENTRIC OPTICAL SYSTEMS

[76] Inventor: Seymour Rosin, 94 Laurel Dr., Massapequa, N.Y. 11762

[21] Appl. No.: 765,894

[22] Filed: Feb. 7, 1977

[51] Int. Cl.² .............................................. G02B 17/08
[52] U.S. Cl. ................................................. 350/199
[58] Field of Search ......................................... 350/199

[56] References Cited

U.S. PATENT DOCUMENTS 3,536,380  10/1970  Ferguson ........................ 350/199

OTHER PUBLICATIONS

J. Dyson, JOSA, "Unit Magnification . . . Aberrations," vol. 49, No. 7, pp. 713–716.

Primary Examiner—Paul A. Sacher
Attorney, Agent, or Firm—Michael J. Striker

[57] ABSTRACT

A concentric self-conjugate optical system of substantially unit power is improved by altering the relations among the concentric spherical surfaces of the system to produce a circular locus of points of zero tangential aberration at a distance from the optical axis. The self-conjugate system is also improved by the incorporation of a novel concentric plano-convex triplet lens. The image and object planes of the concentric self-conjugate system are divorced by the use of prisms. The concentric system with divorced image and object planes is improved by the incorporation of a concentric doublet lens or by the incorporation of a novel concentric plano-convex triplet lens. The concentric system with its divorced image and object planes can also be modified to produce in the divorced image and object planes loci of points of zero tangential aberration.

27 Claims, 16 Drawing Figures

PRIOR ART

UNIT-POWER CONCENTRIC OPTICAL SYSTEMS

BACKGROUND OF THE INVENTION

In July, 1959, J. Dyson published a paper (Journal of the Optical Society of America, 49, 713) disclosing a self-conjugate optical system having certain interesting properties. The present invention relates to modifications and improvements of the Dyson system.

Figure 1:
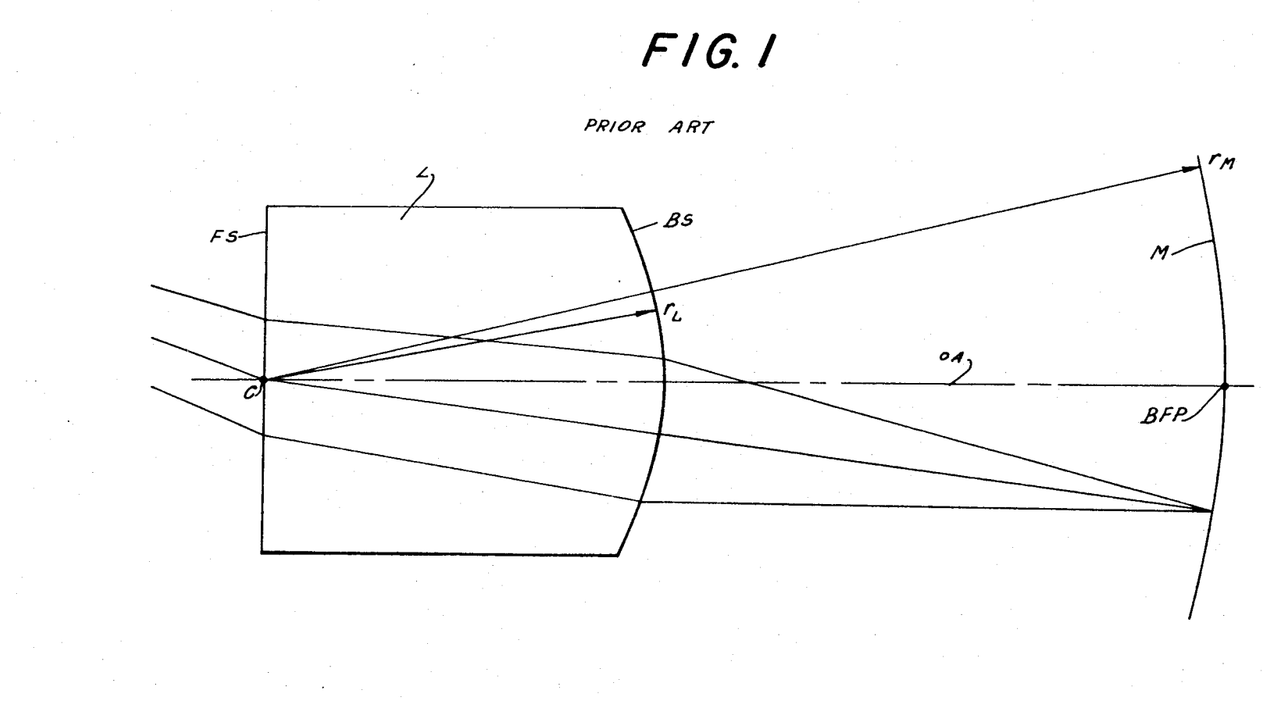
FIG. 1 depicts the optical system disclosed by J. Dyson in the Journal of the Optical Society of America, 49, p. 713, July, 1959.

To establish the general context of the present invention and to make clear the departures from prior-art practice, FIG. 1 of the drawing depicts the basic design of the Dyson system. As shown in FIG. 1, the Dyson system is essentially comprised of a concave spherical mirror M having a center of curvature C and a plano-convex lens L. The planar front surfaces FS of the plano-convex lens L is coincident with the center of curvature C of the spherical mirror M. The spherical back surface BS of the lens L is concentric with the spherical mirror M. The spherical mirror MS is located coincident with the paraxial back focal point BFP of lens L.

According to the Dyson principle, if the refractive index of the lens is $n$, and if the radii of the spherical back surface BS of the lens L and of the spherical mirror M are $r_L$ and $r_M$, respectively, then $r_L$ and $r_M$ are to be related by the equation $$r_L = (n - 1)/n \cdot r_M.$$

Because of the concentricity of the spherical surfaces BS and M, the Dyson system is self-conjugate, with image and object planes coinciding with the planar front surface FS of the lens L.

Dyson explains that the concentric relationship of the spherical surfaces in conjunction with the relationship between $r_L$ and $r_M$ indicated above causes the seven Seidel aberrations to become zero.

Dyson also explains that the sagittal field for the system is flat to all orders. However, Dyson notes that higher-order tangential astigmatism in his system is of such a character as to markedly limit the size of the useful field. This tangential aberration is proportional to the fourth power of the size of the field (the distance from the optical axis of the system) and is convex to the planar front surface FS of the lens L (overcorrected).

Figure 2:
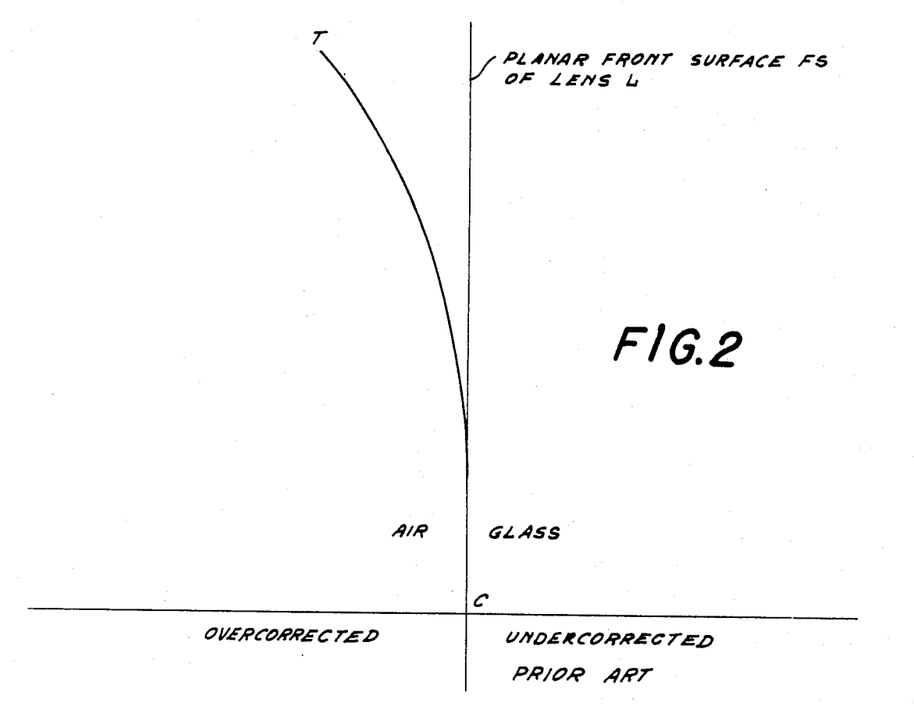
FIG. 2 depicts graphically the tangential aberration of the Dyson system.

FIG. 2 of the drawing illustrates the character of this tangential aberration in the Dyson system. The tangential focal surface T represents the loci of the object points of the system produced by tangential rays. Plotted along the horizontal axis are the distances of such tangential-field object points from the planar front surface FS of lens L. Plotted along the vertical axis are the distances of the object points from the optical axis OA of the Dyson system. It will be noted that the tangential aberration in question is zero at the optical axis, is initially of low value as one proceeds away from the optical axis, and then begins to increase more and more steeply as one proceeds still further away from the optical axis. As indicated above, this tangential aberration is proportional to the distance of the object point from the optical axis, raised to the fourth power. Also to be noted is that the tangential field is overcorrected for all field sizes, i.e., is always located in the space in front of the planar front surface FS of the lens, and is at no point undercorrected, i.e., is at no point located within the material of lens L behind the planar front surface FS of the lens.

Dyson points out implicitly that the spherical mirror M constitutes the system stop. Because the mirror M is located, in accordance with the equation presented above, at the paraxial back focal point BFP of the lens L, the chief rays entering the planar front surface FS of the lens are all parallel to the optical axis OA, in so far as third-order aberrations are concerned. However, the spherical back surface BS of the lens produces spherical aberration in the bundle of chief rays, so that a representative chief ray emerges from the system at the planar front surface FS at an exit angle different from its entrance angle; the aberration depicted in FIG. 2 of the drawing is a result of this. The severity of this tangential aberration led Dyson to express the belief that his system was restricted to small field size, albeit large apertures.

SUMMARY OF THE INVENTION

It is a general object of the present invention to improve upon the self-conjugate optical system of Dyson, discussed above.

A specific object of the invention is to provide a self-conjugate optical system of the Dyson type but characterized by reduced tangential aberration and accordingly larger useful fields.

Another object of the invention is to provide a self-conjugate optical system of the Dyson type in which there is produced at the coincident image and object planes at a predetermined distance from the optical axis of the system a locus of points of zero tangential aberration.

It is a related object to be able to compensate for the spherical aberration of the plano-convex lens in the Dyson system while at the same time producing the aforementioned locus of points of zero tangential aberration.

It is another general object to provide a unit-power optical system of the Dyson type in which, however, the image and object planes of the self-conjugate Dyson system are divorced more advantageously than in the prior art.

It is a related object to provide such a system wherein the image and object planes are divorced and in which at the same time the tangential aberration of the system is decreased relative to comparable prior-art optical systems.

It is a further related object to provide such a system wherein the image and object planes are divorced and in which there is produced at the object plane a locus of points of zero tangential aberration.

It is another related object to provide a system wherein the image and object planes are divorced and in which the spherical aberration of the lens of the system is corrected without loss of the aforementioned locus of points of zero tangential aberration.

It is still another related object to provide a system of the Dyson type in which the object and image planes are divorced by means of prisms with little or no loss of the useful light of the system.

It is a related object to provide prisms for divorcing the image and object planes of the Dyson system which not only divorced these planes in a manner different from the prior art, but are furthermore configured to minimize the amount of refractive material needed for this purpose and in order to achieve a corresponding economy.

It is a further object to provide a self-conjugate optical system of the Dyson type in which both the spherical and chromatic aberrations of the plano-convex lens are corrected to a degree not possible in the prior art.

It is another object of the invention to provide a novel high-speed spectrograph utilizing an improved version of the self-conjugate optical system of Dyson.

It is a further object of the invention to provide a unit-power optical system of the Dyson type in which the image and object planes are divorced, utilized in an apparatus for forming a copy from an original, and particularly for forming a semiconductor circuit from a pattern therefor, as well as a method of performing the copying.

The ways in which these objects can be achieved will be evident from the description, below, of preferred embodiments of the invention, when read in connection with the accompanying drawings.

DESCRIPTION OF THE PREFERRED EMBODIMENTS

In order to be able to understand how the preferred embodiments of the invention, described below, achieve the various objects of the invention, it is appropriate to first review basic principles underlying the concentric, unit-power, self-conjugate optical system of Dyson.

Figure 3:
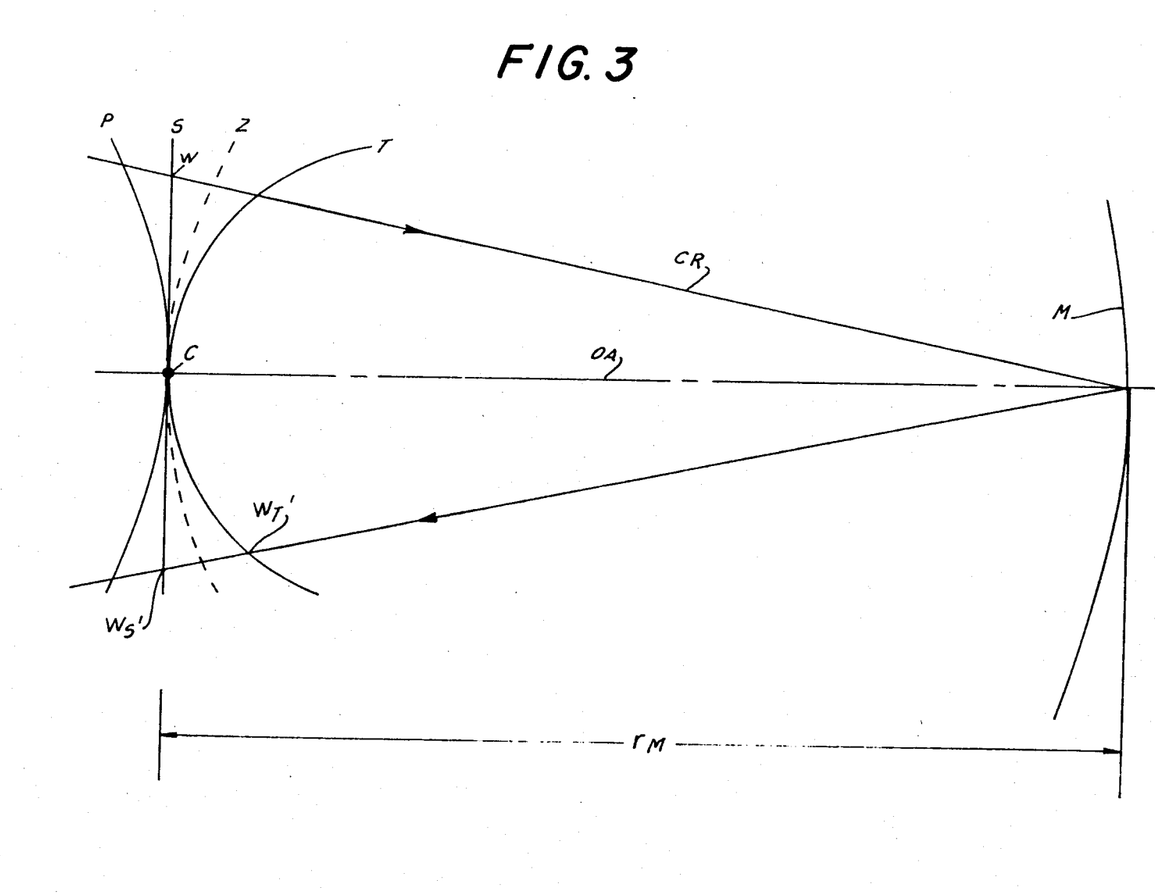
FIG. 3 depicts the Petzval surface, sagittal focal surface, tangential focal surface and Rowland circle of a concave spherical mirror.

First to be considered is the field situation associated with a concave spherical mirror used alone. Attention is directed to FIG. 3 of the drawing.

In FIG. 3, a concave spherical mirror M has a center of curvature located at C, a radius $r_M$ and accordingly a curvature $R_M = 1/r_M$.

According to Seidel theory, the spherical mirror M has a Petzval surface P of curvature $-2R_M$, convex to the mirror as shown. The astigmatic coefficient A of this simple system (with the system stop constituted by the mirror) is also $-2R_M$.

The curvatures of the sagittal and tangential focal surfaces S and T for an object plane coincident with the center of curvature C of mirror M are found from the equations $$S = P - A = 0$$

and $$T = P - 3A = 4R_M.$$

Thus, the sagittal focal surface S is perfectly flat and coincident with the object plane, whereas the tangential focal surface T has four times the curvature of spherical mirror M and is concave relative thereto.

An object point W on the flat sagittal focal surface S is imaged by sagittal rays at a point W' on the sagittal focal surface S, and is imaged by tangential rays at a point W'$_t$ on the tangential focal surface T. If the object point W is advanced along its associated chief ray CR to a point half way between surfaces S and T, as measured along the chief ray, image point W'$_t$ will recede to this same surface Z. Surface Z is the Rowland circle; it is of curvature $2R_M$ and is concave relative to the spherical mirror M.

Two months after the publication of Dyson's original paper, the present inventor published a paper (Journal of the Optical Society of America, Volume 49, Number 9, pp. 862–864) in which it was pointed out that the interposition of a spherical refracting surface whose center is coincident with a conjugate point of a concentric optical system has no effect upon the sagittal field of the system and would only affect the tangential field. The addition by Dyson of his plano-convex lens L (FIG. 1) to the spherical mirror M of FIG. 3 can be looked upon as an example of this principle. The planar front surface FS of Dyson's plano-convex lens L has no effect on either the sagittal or tangential focal surfaces. The convex back surface BS of the lens, because it is concentric with the spherical mirror M, has no effect upon the perfectly flat sagittal focal surface. Furthermore, the convex back surface BS of Dyson's lens L would in principle drive the P, Z and T surfaces of FIG. 3 into coincidence with the flat sagittal focal surface S, were it not for the higher-order (fourth-power) tangential aberration of the system, referred to herein as the Dyson aberration.

According to the present invention, it is possible to decrease the Dyson aberration by departing from Dyson's critical relationship $r_L = (n-1)/n \cdot r_M$ for the radii of the spherical mirror M and of the spherical back surface BS of the plano-convex lens L. The departure contemplated by the invention is an increase in the value of $r_L$ relative to the Dyson value.

This departure from Dyson's critical radii relationship has no effect upon the perfect flatness of the sagittal focal surface, because the spherical back surface BS of the lens is still concentric with the spherical mirror M.

In contrast, the departure in question produces a certain amount of undercorrection of the tangential focal surface T, tending to offset the overcorrected tangential aberration of Dyson depicted in FIG. 2 of the drawing.

Unfortunately, the undercorrection of the tangential focal surface resulting from the contemplated departure from Dyson's critical radii relationship represents a true Seidel aberration, and this added component of tangential aberration is proportional to the second power of the field (distance from the optical axis). Because the Dyson aberration is proportional to the fourth power of the field, the additional component of tangential aberration resulting from the inventive departure from Dyson's relationship cannot exactly cancel out the Dyson aberration. Nevertheless, there is achieved a very meaningful improvement of the tangential aberration of the Dyson system.

Figure 4:
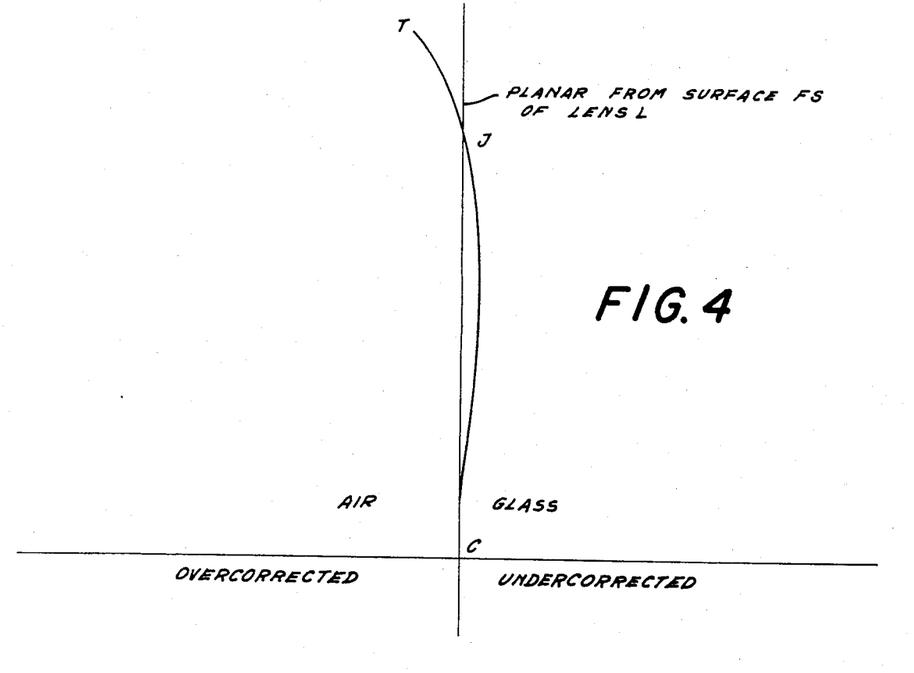
FIG. 4 depicts graphically the alteration of the tangential aberration of the Dyson system by departing from the radii relationship critical for the Dyson system.

FIG. 4 of the drawing depicts the shape of the tangential focal surface T when the inventive departure from Dyson's critical radii relationship is utilized. At low field values (distances from the optical axis), the component of tangential aberration resulting from the inventive departure from Dyson's radii relationship (undercorrected, and proportional to the second power of the field value) dominates Dyson's component of tangential aberration (overcorrected, and proportional to the fourth power of the field value); the resultant tangential aberration is undercorrected, and increasingly undercorrected with increasing field value.

At a certain field value, Dyson's fourth-power tangential aberration component begins to predominate; accordingly, with further increases of field value, the tangential focal surface, although still undercorrected, is now decreasingly undercorrected.

As the field value is still further increased, the decreasingly undercorrected tangential focal surface intersects the planar front surface FS of the lens. This is indicated in FIG. 4 by point J, hereafter referred to as the J-point, and denoting a circular locus of points of zero tangential aberration located at the common image and object planes and spaced a predetermined distance from the optical axis OA of the system. For field values beyond the J-point, the tangential focal surface T is increasingly overcorrected.

It will be appreciated that the tangential aberration of Dyson (FIG. 2) is in several respects improved as a result of the inventive departure from Dyson's critical radii relationship. For field values lower than the J-point, the tangential aberration component introduced according to the inventive concept partially cancels Dyson's tangential aberration component, so that within this field value range the magnitude of the tangential aberration will be reduced. Additionally, the creation of a locus of points of zero tangential aberration at the J-point is a very noteworthy and characteristic feature of the concept in question. This zone of zero and near-zero tangential aberration can be of independent usefulness in certain applications.

The field value at which the J-point locus of zero tangential aberration is produced can be selected by selecting the amount by which the radius $r_L$ of the back surface of lens L is to deviate from the value specified in Dyson's radii equation. However, the shape of the bulge in the T curve of FIG. 4 intermediate points C and J will depend upon the extent of the departure from Dyson's radii relationship, and therefore freedom in choosing the location of the J-point locus will be restricted by the need to keep the magnitude of that bulge within the limits appropriate for the intended application.

A numerical example will now be described. Assume that the spherical mirror M has a radius of 100 units and that the refractive index of the lens L to be used is $n = 1.69$. In accordance with Dyson's radii relationship, the radius $r_L$ for the back surface BS of lens L should be 40.83 units, with the Dyson air space accordingly being 59.17 units. However, instead of the Dyson radius of 40.83 units, a radius $r_L = 43.0$ units is selected, so that the lens-mirror air space will be 57.0 units. Also postulated are an entering and exit beam of relative aperture F/3. The diameter of the mirror is 19.71 units. The reason why the mirror diameter is less than 1/5 the mirror radius instead of ⅓ the radius is that the system is basically an immersion one, thus achieving an economy of structure for any given beam aperture.

The J-point for this system is located at a distance of about 10 units from the optical axis. If the useful field is defined as that at which the maximum tangential aberration is less than 0.01 units, the off-axis field coverage can be extended out to 11.0 units, a far from negligible field. It is worth pointing out again that the sagittal bundles for all colors are exactly zero throughout the entire field. The blur circles are all lines in the radial direction. At the J-point field value, monochromatic tangential ray bundles all have zero aberration. There is a small color residual due to the fact that the J-point varies as a function of index. The maximum length of the line aberrations occurs at 0.7 to 0.8 of the J-point location, and this value is again reached at 1.1 of the J-point location.

The foregoing explanation of how the J-point locus is produced has been formulated in terms of departure from Dyson's critical radii relationship $r_L = (n - 1)/n \cdot r_M$, it being indicated that the departure involves making $r_L$ greater than the value specified by the Dyson equation. However, an alternative definition of the departure from the Dyson relationship is possible, and furthermore, it has the advantage of making clear the actual design procedure involved for establishing the J-point at a particular field value.

According to this alternate definition, the departure from Dyson's relationship is to be expressed in terms of the distance between the spherical mirror M and the back focal point BFP of the plano-convex lens L. In the Dyson system, the spherical mirror M is located at the back focal point, BFP, as indicated in FIG. 1. The inventive departure from Dyson's relationship can be conceived of as a shift of the mirror M away from the back focal point BFP and towards the lens L.

According to the inventive concept in question, the amount of this shift should be equal to at least 1% of the radius $r_L$ of the back surface BS of the lens L, in order to produce meaningful improvements of the tangential aberration of the Dyson system. This is depicted in FIG. 5, which illustrates one embodiment of the inventive system.

In correspondence to the above alternative definition of the departure from the Dyson concept, a simple design procedure can be explained with reference to FIG. 5. First, the J-point distance from the optical axis OA is selected. Then, a ray (the single-arrow ray in FIG. 5) entering the planar front surface FS of the lens Z through the J-point and parallel to the optical axis is trigonometrically traced through the lens, its refraction at the spherical back surface BS determined, and its point of intersection with the optical axis behind the lens ascertained. The mirror M is then positioned at this intersection point, as indicated in FIG. 5. FIG. 5 additionally depicts a convergent chief ray (the double-arrow ray) passing through the optical system.

Figure 5:
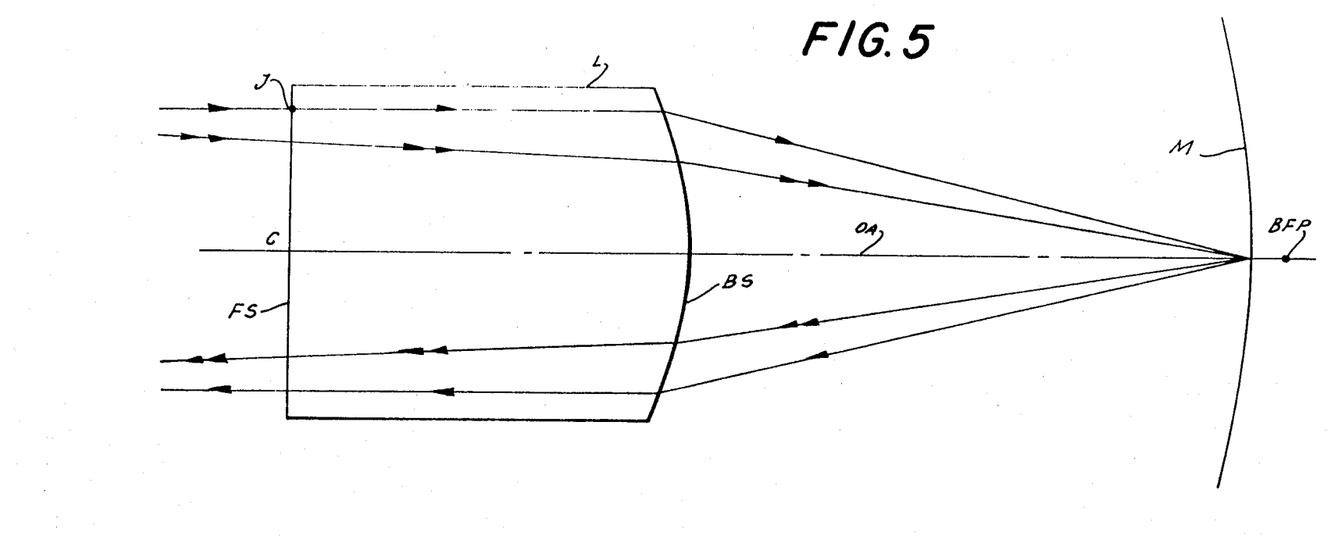
FIG. 5 depicts an inventive self-conjugate concentric system.

In general, the J-point locus of FIG. 5 will be located inwardly of the perimeter of the planar front surface FS of the lens L. However, in principle, the shape of the lens could be so altered that the J-point might fall radially outward of the physical perimeter of the front surface FS. Likewise, it is at least in principle possible to select the position of the J-point beyond the perimeter of the front surface FS. In either event, although there would then not actually be a J-point locus on the front surface FS, the tangential aberration decrease depicted in FIG. 4 would still be achieved, so that the inventive concept would still be involved in that particular sense.

One interesting possible application for the simple-lens self-conjugate system of the invention is in a high-speed spectrograph. With the Dyson system modified as explained above, the Rowland circle Z referred to in the explanation of FIG. 3 becomes a planar surface coincident with the planar sagittal focal surface S. Accordingly, the invention contemplates providing a Rowland grating on the reflecting surface of the spherical mirror MS. Preferably, the light to be diffracted is introduced into the system at the J-point, the grating space being so chosen as to diffract the region of interest near the optical axis of the system. The advantage over the classical Rowland arrangement is the high concentration of energy which is achieved, since the system is free of astigmatism.

Figure 6:
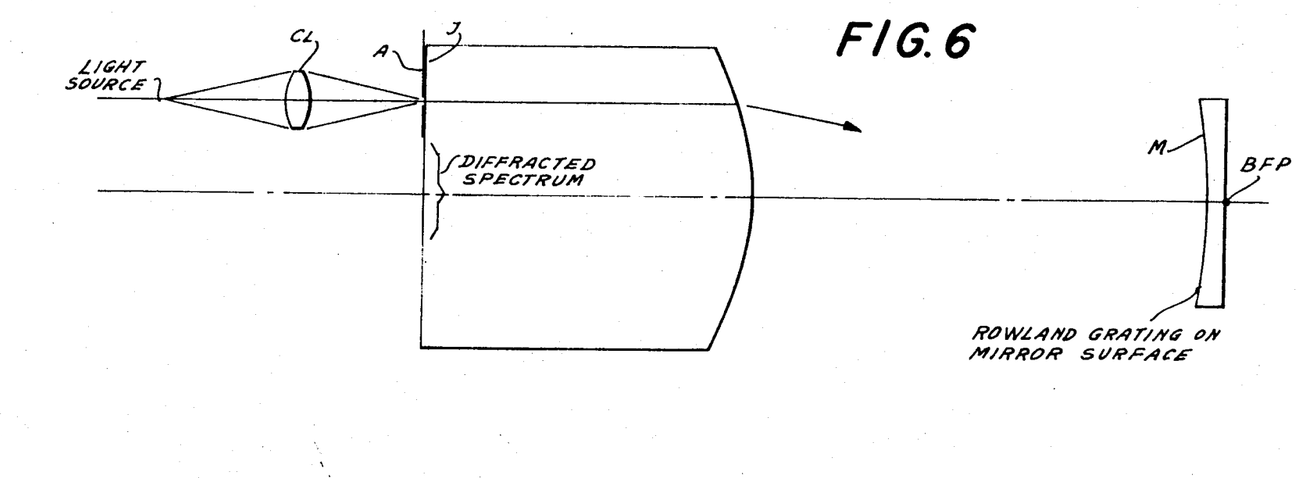
FIG. 6 depicts the system of FIG. 5 modified for use as a high-speed spectrograph.

FIG. 6 depicts such a system. A slit aperture A is arranged at the J-point locus of the system. A condenser lens L injects into the J-point the light from a light source to be analyzed. A Rowland grating is provided on the reflecting surface of the spherical mirror M, with the lines of the grating extending perpendicular to the plane of the Figure. The diffracted spectrum is produced at the indicated region.

The application of the inventive self-conjugate system described above to a spectrograph has been mentioned at this point because the input and output information of the optical system would anyway of separate from each other, so that the coincidence of the image and object planes of the self-conjugate system would present no particular problem. However, for many applications this would not be the case, and it would be necessary to reserve one half of the circular field for input information and the other half for output information. This can be accomplished, according to another concept of the invention, by utilizing prisms to divorce the image and object planes from each other.

Figure 7:
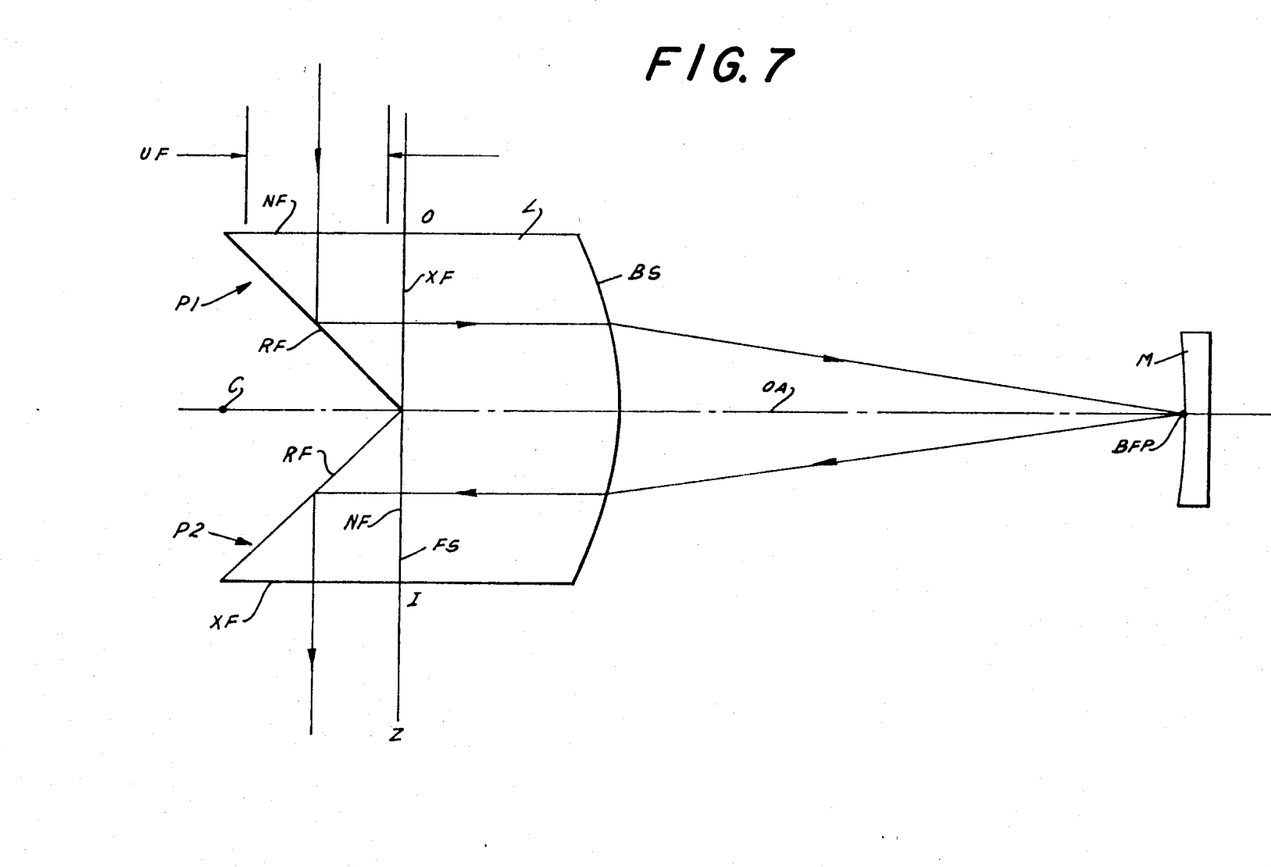
FIG. 7 depicts an inventive concentric optical system with divorced image and object planes and exhibiting tangential aberration similar to that graphically depicted in FIG. 2.

FIG. 7 depicts one embodiment of this concept. In FIG. 7, the planar surface FS of the plano-convex lens L no longer passes through the common center of curvature C of the lens back surface and the mirror M, but instead is located intermediate C and BS. The system of FIG. 7 includes two right-angle 45° prisms P1 and P2. Each has a planar entrance face NF, a planar exit face XF and an inclined planar reflecting face RF. The exit face XF of prism P1 and the entrance face NF of prism P2 adjoin the planar front surface FS of the lens L. The dimensions of each of the prisms P1, P2 are such that, for rays passing through the lens front surface FS parallel to the optical axis, the travel distance through the prism is equal to the distance between the center of curvature C and the lens front surface FS, as measured along the optical axis OA. As a result, the object plane O of the system is coincident with the entrance face NF of prism P1, while the image plane I of the system is coincident with the exit face XF of prism P2. For both the object plane I at NF of P1, and for the image plane O at XF of P2, the useful field will be generally semicircular. However, as indicated in FIG. 7, the useful field UF will be somewhat reduced by the need for retention of the interior angle at the reflecting face. If nearly the full semicircular fields available for the input and output information are to be utilized, then the lengths of the prism P1, P2, measured in the direction perpendicular to the plane of the drawing, will equal the diameter of the circular front face FS of lens L.

The most important feature of the embodiment depicted in FIG. 7 is that each of the two inclined reflecting faces FR of the prism has an inner edge located near the optical axis OA and near the planar front surface FS of the lens L. Here, the inner edges of the two inclined faces RF actually intersect the optical axis OA and actually lie on the plane defined by front surface FS. As a result, the best part of the field is most fully utilized, and the loss of light resulting from the divorce of the image and object planes is extremely low. Additionally, the volume of material required for the prisms P1, P2 is very substantially less than if the Dyson system were modified to incorporate a cubical beam splitter having an edge length equal to the diameter of circular surface FS and provided with an internal semitransmissive reflecting surface oriented at 45° to the optical axis, with its edges located far removed from the optical axis. The prism arrangement depicted in FIG. 7 is accordingly of particular advantage in an optical system of the Dyson type.

Figure 8:
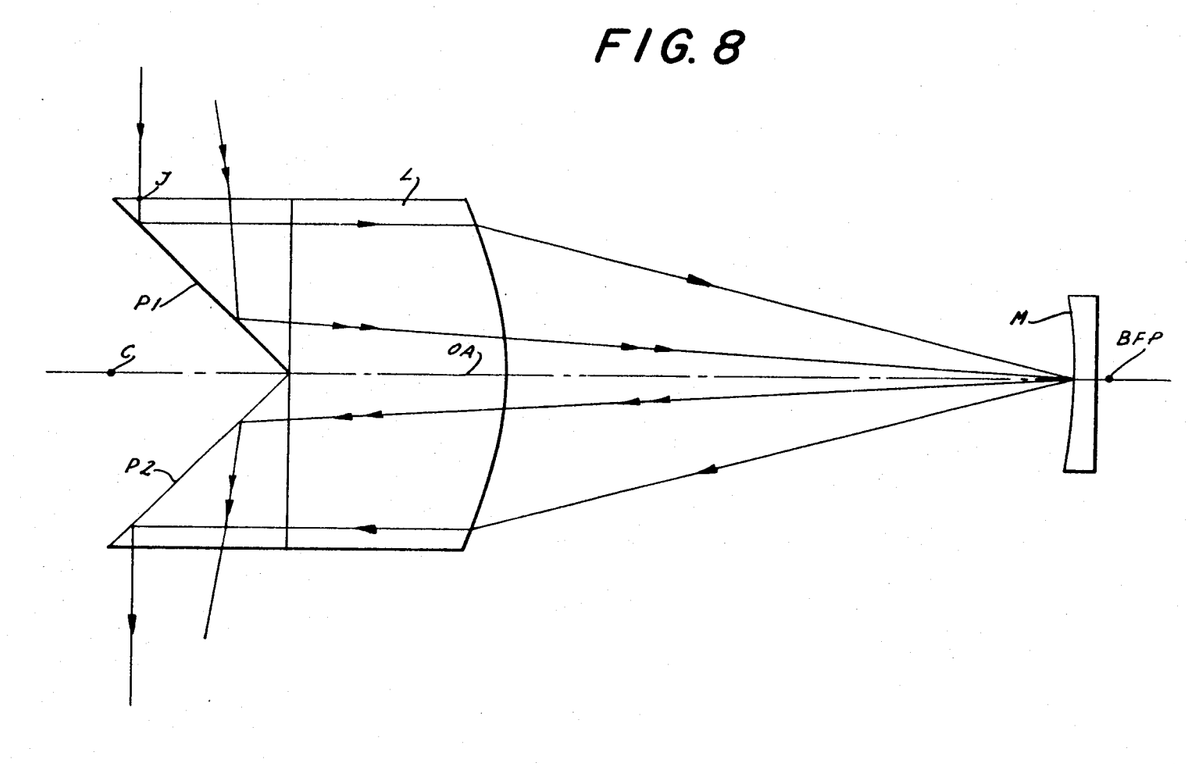
FIG. 8 depicts a modification of the system of FIG. 7 exhibiting reduced tangential aberration similar to that graphically depicted in FIG. 4.

It is to be noted that in FIG. 7 the spherical mirror M is located coincident with the back focal point BFP of the combination of prisms P1, P2 and lens L; this corresponds to Dyson's critical radii relationship. However, the advantages of the inventive use of such prisms for divorcing the image and object planes of a concentric self-conjugate system are likewise applicable to a concentric system in which the Dyson radii relationship is departed from in accordance with the inventive principle explained above. FIG. 8 depicts this latter possibility. In FIG. 8, mirror M is not coincident with the back focal point BFP of the lens-prism combination; instead, it is located shifted towards the lens L and coincides with the point on the optical axis where a ray entering prism P1 at the J-point locus and passing through the front surface of lens L parallel to the axis OA intersects the axis OA behind the lens.

If FIGS. 7 and 8 are considered plan views, the image produced by the systems will be inverted but not reverted, and therefore left-handed.

Figure 9A:
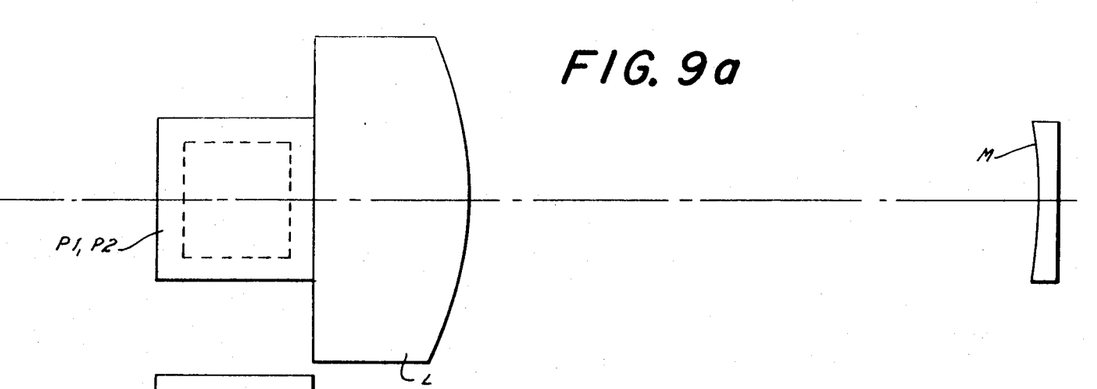
FIGS. 9a and 9b depict another modification of the system of FIG. 7.
Figure 9B:
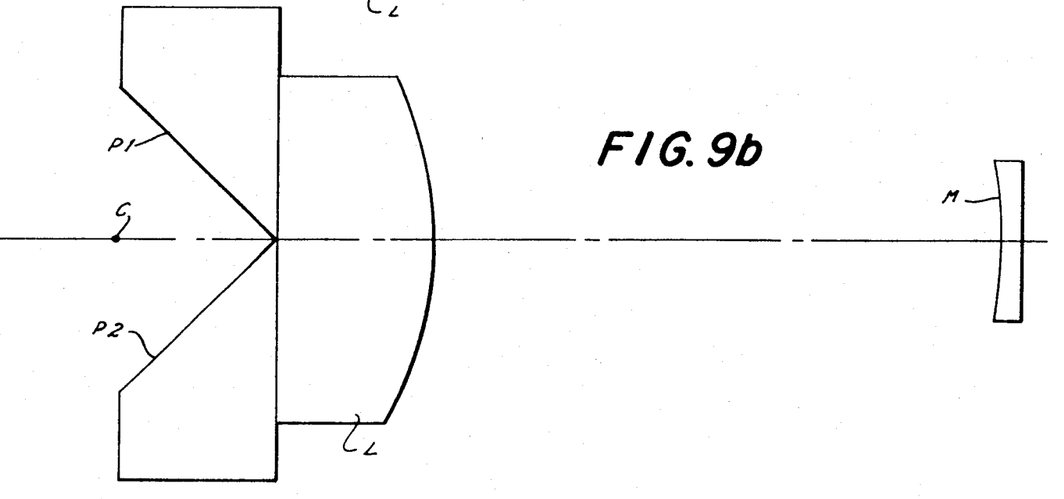

Prisms of different configuration are depicted in FIGS. 9a and 9b, which are top and side views of a system to be utilized for the reproduction of 35 mm photographic film. This embodiment takes advantage of the fact that the prism expedient of FIGS. 7 and 8, aside from its simplicity and the other advantages mentioned above, is capable of much higher apertures than conventional 1:1 optical systems.

In FIG. 9a the area indicated by broken lines represents the position of a film frame to be copied or printed. A corresponding area at the exit face of the lower prism is utilized for the copying material. The projecting ears of the prisms at the object and image planes are provided for the purpose of incorporating so-called "liquid-gates" often used in this particular application and optically equivalent to solid glass. A lens commonly used in this application is the Ektar 6 inches F.2/8 lens. The system should do better at an equivalent F/1.5 (F/3 input and output beams), the relative dimensions of which are illustrated in FIGS. 9a and 9b. The scale for a 1 inch × ¾ inch coverage will require a mirror radius of about 10 inches.

Figure 10:
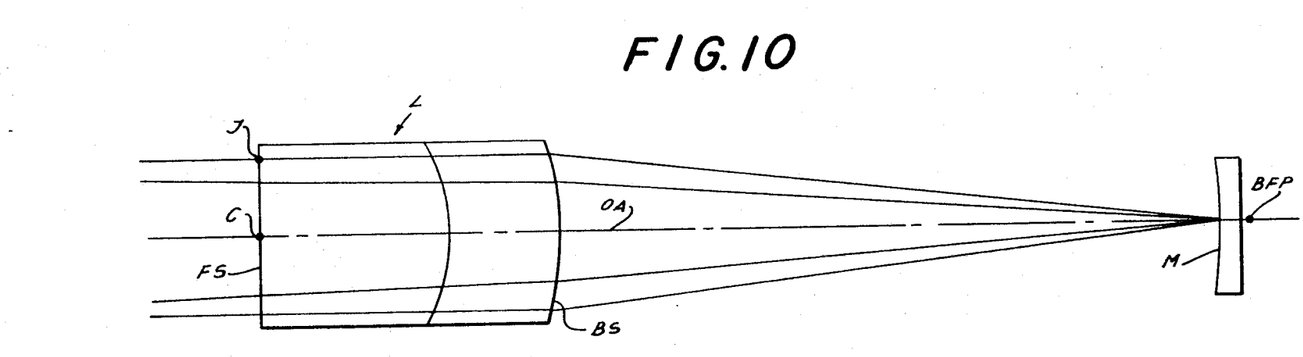
FIG. 10 depicts an inventive self-conjugate concentric optical system exhibiting reduced tangential aberration such as graphically depicted in FIG. 4.
Figure 11:
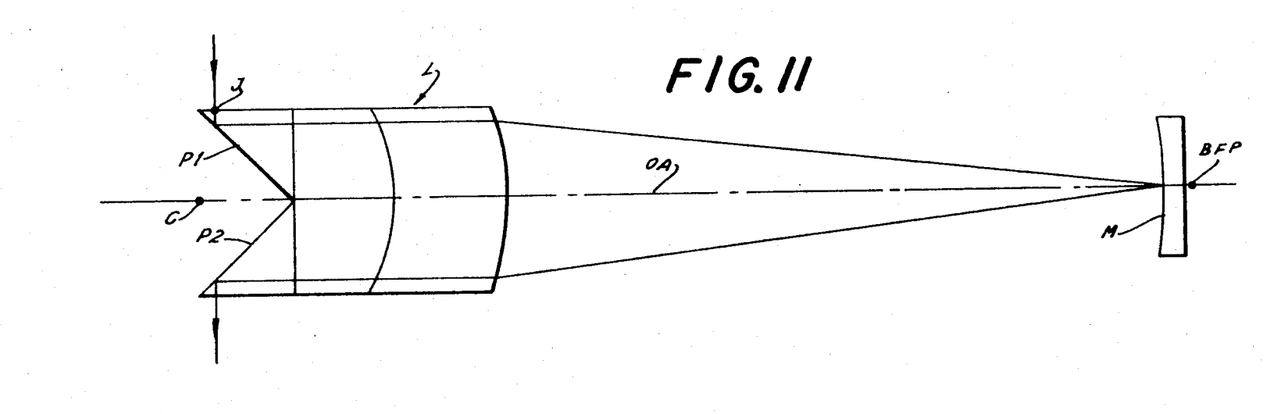
FIG. 11 depicts a modification of the system of FIG. 8 but exhibiting improved spherical aberration.

When utilizing the J-point concept discussed above, either in the self-conjugate system of FIG. 5 or else in the system of FIG. 8 with its divorced image and object planes, a problem may be presented by the spherical aberration of the plano-convex lens L. When it is desired to correct for such spherical aberration, the simple lens L of the systems of FIGS. 5 and 8 can be replaced by a doublet lens, as shown in FIGS. 10 and 11. In per se conventional manner, the second element of the doublet is utilized to correct for the spherical aberration of the first element; additionally, the second element will tend to correct for chromatic aberration of the first element. In either case, however, the back spherical surface of the first element and the front spherical surface of the second element must be concentric with the back surface of the doublet and with the spherical mirror, so as not to upset the perfect flatness of the sagittal focal surface resulting from the concentric principle.

According to the invention, the use of a doublet lens in this way is contemplated for the following three cases:

First, a self-conjugate concentric system in which the spherical mirror coincides with the point at which rays entering the system at the J-point locus and passing through the front surface of the plano-convex lens parallel to the optical axis intersect the optical axis behind the lens. Such a system is shown in FIG. 10.

Second, a concentric system with divorced image and object planes in which the spherical mirror is offset from the back focal point of the doublet towards the plano-convex lens by a distance equal to at least 1% of the radius of the back surface of the doublet, and in which the mirror coincides with the point at which rays entering the system at the J-point locus and passing through the front surface of the plano-convex lens parallel to the optical axis intersect the optical axis behind the lens. Such a system is shown in FIG. 11.

Third, a concentric system with divorced image and object planes wherein the spherical mirror coincides with the back focal point of the plano-convex doublet. Such a system is not illustrated, but would be similar to that of FIG. 11, except for the location of the mirror relative to the back focal point of the lens.

When doublets are employed in any of the three cases enumerated above, to correct for the spherical aberration of the plano-convex lens, the refractive index of the meniscus will in general be substantially larger than that of the positive element, and likewise the dispersion of the meniscus will be greater than that of the positive element.

Figure 12A:
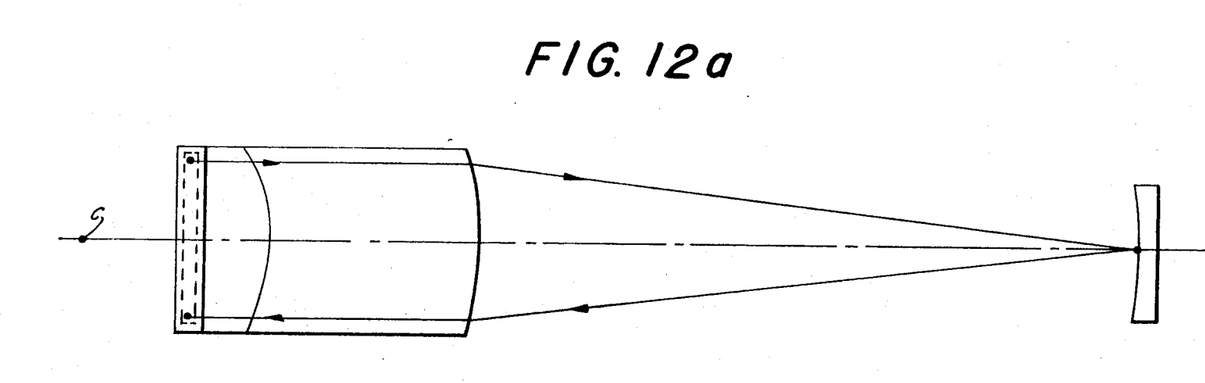
FIGS. 12a and 12b depict a modification of the system of FIG. 11.
Figure 12B:
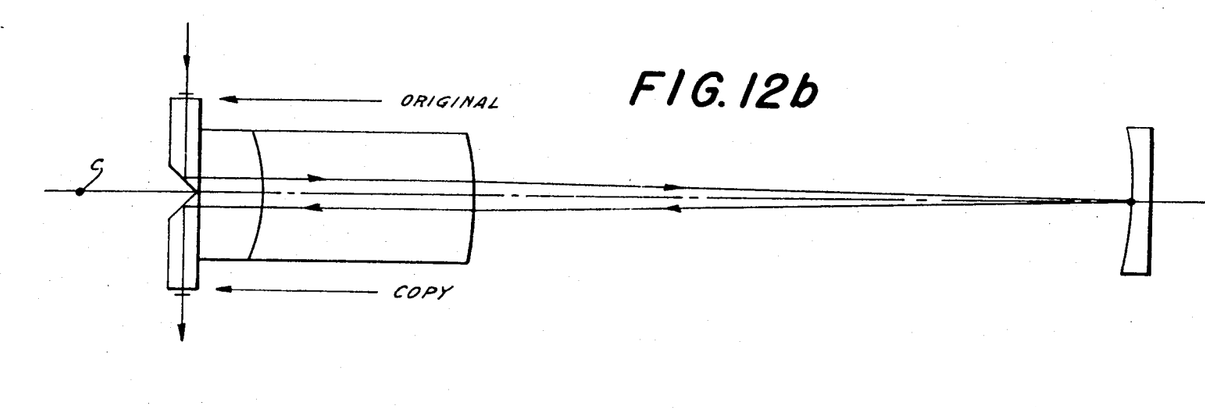

FIGS. 12a and 12b depict an embodiment of the invention making use of the prism expedient of FIG. 7 for the separation of the image and object planes, and also utilizing a plano-convex doubled lens. FIG. 12a is a top view and FIG. 12b a side view of the system. Here, the prisms are of a particularly unusual configuration. Their length (their vertical dimension as viewed in FIG. 12a) is much greater than their width (their horizontal dimension as viewed in FIG. 12b). Moreover, their inclined reflecting surfaces are considerably shorter than the radius of the circular front surface of the plano-convex doublet. Accordingly, only the central portion of the potentially available field is utilized. In particular, the field actually utilized is of long and narrow, slit-like shape, as indicated by the broken lines in FIG. 12a.

If the horizontal faces of these prisms (as viewed in FIG. 12b) were extended leftward, and if the inclined reflecting faces of the prisms were extended outward away from the optical axis to intersect the extended horizontal faces, these would be simple three-sided, right-angled 45° prisms. The prisms as actually depicted can be considered truncated versions of such three-sided prisms. Such truncation eliminates from the prism a very considerable amount of refractive material, and thereby results in an economy of material. The arrangement of FIGS. 12a and 12b is intended for use in forming a copy from an original. Due to the fact that the fields utilized are of slit-shaped rectangular shape, the original is to be transported in the object plane progressively across the entrance face of the upper prism, whereas the copy material is to be transported in the image plane progressively across the exit face of the lower prism.

An advantage of this copying set-up is that the material of the original and the material for the copy can be transported across the object and image fields in the identical direction and at identical speed. It is intended to provide means for positively effecting such identical-direction, identical-speed transport.

The characteristic configuration of the prisms in FIGS. 12a and 12b can be expressed with reference to the fact that the inclined reflecting faces of the prisms are rectangular. The length (longer dimension) of the rectangular reflecting face is at least five times the breadth (shorter dimension) of the rectangular reflecting face. Additionally, it is to be noted that these are foursided prisms, with the fourth face extending parallel to the face of the prism adjoining the planar front face of the lens.

The invention contemplates a further improvement of the systems in question. As explained above, instead of a simple plano-convex lens, use can be made of a doublet, the second element of which corrects for the spherical aberration of the first. Moreover, as already indicated, the second element of the doublet will also effect a certain amount of correction of the chromatic aberration of the first element. Considering the many desirable properties of the systems described above, it would be desirable to further improve the systems by substantially total correction of both the spherical and the chromatic aberration of the plano-convex lens.

If that could be accomplished a single spherically and chromatically corrected back focal point for the plano-convex lens would be produced, and the concave spherical mirror could then be placed at such focal point.

Considering first the spherical correction alone, and assuming two refractive materials of respective indices and dispersions for the two elements of the concentric doublet, it would in general be possible to properly locate the spherical intermediate surface of the doublet to effect complete spherical correction.

Likewise, with respect to chromatic aberration, it would in general be possible to properly locate the spherical intermediate surface of the doublet to effect complete chromatic correction.

However, given two refractive materials of specified respective indices and dispersions, the location of the intermediate spherical surface of the doublet will be different depending upon whether complete spherical correction or complete chromatic correction is to be achieved.

Accordingly, the invention contemplates, as a further improvement upon the Dyson system, the use therein of a plano-convex triplet. In particular, the triplet is to be a concentric one, with its back spherical surface and its two intermediate spherical surfaces sharing the center of curvature of the spherical mirror of the system.

The use of a plano-convex triplet all of whose spherical surfaces are concentric creates the possibility of effecting substantially complete correction of both the spherical and the chromatic aberration of the plano-convex lens in systems of the Dyson type. The introduction of two concentric intermediate spherical refracting surfaces introduces into the Dyson system two further degrees of freedom, making possible the substantially complete correction of the two aberrations in question.

If there were available for the intermediate element of the triplet a material having the refractive index of one of the outer elements and the dispersion of the other of the outer elements, then total correction of both the spherical and chromatic aberration of the plano-convex lens could be achieved.

In general, however, this is not possible, and what instead is to be achieved is a compromise between complete spherical and complete chromatic correction. Nevertheless, using the concentric plano-convex triplet concept in the Dyson system, both spherical and chromatic correction can be achieved to an extremely high degree. The optimization of the balance between the two corrections cannot be defined in absolute terms, but must be achieved on a trial-and-error basis. Because of the laboriousness of trial-and-error design procedures for optical systems, it is conventional in the art to perform such design procedures using a digital computer. Any of various publicly available trial-and-error design programs can be utilized in the design process, for example the one known in the art as ACCOS V.

A numerical example will be described. Three refractive materials for the three elements of the triplet were selected arbitrarily, except for the condition that the first have the lowest index and dispersion, the second intermediate index and dispersion, and the third the highest index and dispersion. The radius of the spherical back surface of the first element was selected arbitrarily. The computer was instructed to vary the radii of the spherical back surfaces of the second and third elements on a trial-and-error basis, to achieve maximum spherical and chromatic correction for a specified wavelength range.

The materials and radius selected initially and the numerical values selected by the computer are tabuled as follows:

| R | Thickness | Medium |
|---|---|---|
| plano | 20.000 | Schott BK7 |
| −20 | 14.249 | Schott BAF 52 |
| −34.249 | 14.038 | Schott SF1 |
| −48.287 | 134.5 | air |
| −178.787 (stop) | — | reflect |

This system was essentially totally free of both spherical and chromatic aberration out to a distance of 10 units from the optical axis.

Figure 13:
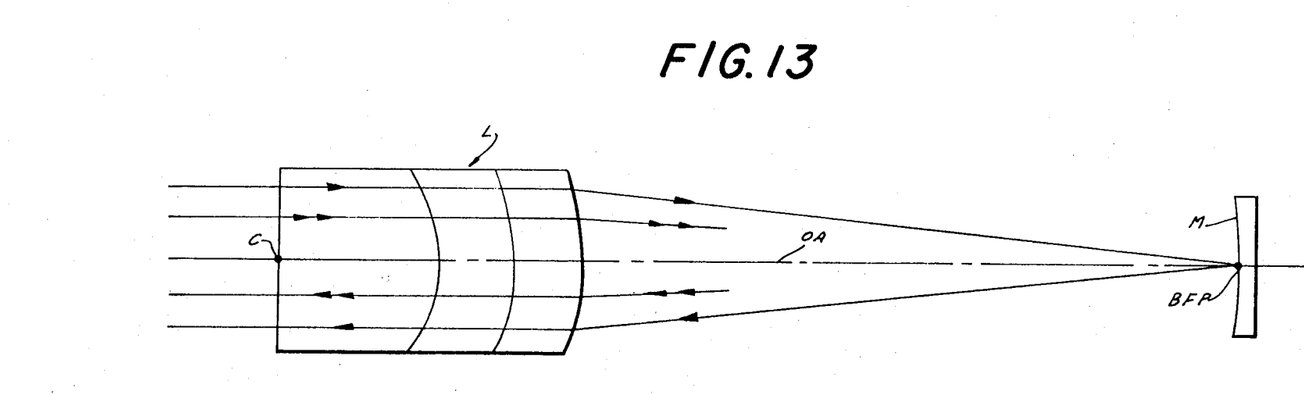
FIG. 13 depicts an inventive self-conjugate concentric optical system including a concentric triplet and exhibiting reduced spherical and chromatic aberration.
Figure 14:
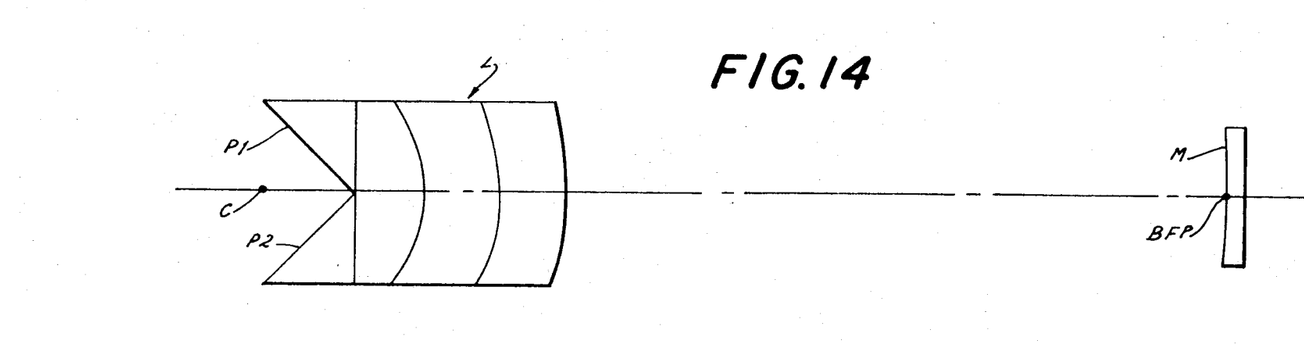
FIG. 14 depicts a modification of the system of FIG. 7 exhibiting reduced spherical and chromatic aberration.

The concentric plano-convex triplet contemplated by the invention can be used either in a self-conjugate concentric system or in a concentric system in which the image and object planes are divorced by prisms in the manner described above. The former possibility is illustrated in FIG. 13 and the latter in FIG. 14. In FIGS. 13 and 14, the spherical mirror M is positioned coincident with the spherically and chromatically corrected back focal point BFP of the concentric triplet (FIG. 13), or of the equivalent combination of the prisms and concentric triplet (FIG. 14).

In the embodiments depicted in the drawing, the facing spherical surfaces of the elements of the doublets and triplets are in contact; however, small intervening air spaced could be present. Likewise, where the faces of the prisms adjoining the planar front surfaces of the plano-convex lenses are depicted as being on contact with those front surfaces, small intervening air spaces could be present.

It will be understood that each of the elements described above, or two or more together, may also find a useful application in other types of constructions differing from the types described above.

While the invention has been illustrated and described as embodied in particular optical systems, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. A self-conjugate optical system of substantially unit power, comprising, in combination, a concave spherical mirror having a center of curvature; and a lens having a planar front surface coincident with said center of curvature and coincident with the image and object planes of the self-conjugate optical system and a spherical back surface intermediate said spherical mirror and said center of curvature and concentric with said spherical mirror, said spherical back surface and said spherical mirror being spaced apart a distance producing at said planar front face at a predetermined distance from said center of curvature a locus of points of zero tangential aberration.

2. The optical system defined in claim 1, said lens having a back focal point, said distance between said spherical back surface and said spherical mirror being such that said spherical mirror is offset from said back focal point of said lens by a distance equal to at least 1% of the radius of said spherical back surface of said lens.

3. The optical system as defined in claim 1, said lens being a simple lens of refractive index $n$, said spherical back surface having a radius $r_1$, said spherical mirror having a radius $r_m$, said distance between said spherical back surface and said spherical mirror being less than $r_1/n$.

4. The optical system defined in claim 1, said lens being a doublet lens comprised of a plano-convex first component lens having a planar front surface and a spherical back surface and a second component lens having a spherical front surface and a spherical back surface, all of said spherical surfaces being concentric, the dimensions, dispersion and refractive index of said second component lens being such as to correct for the spherical aberration of said first component lens.

5. The optical system defined in claim 4, said doublet lens having a back focal point, said spherical mirror being located intermediate said back spherical surface of said doublet lens and said back focal point, said spherical mirror being spaced from said back focal point a distance equal to at least 1% of the radius of said back spherical surface of said doublet lens.

6. The optical system defined in claim 4, rays passing through said planar front surface of said doublet lens at said locus of points of zero tangential aberration and parallel to the optical axis of said doublet lens intersecting said optical axis behind said doublet lens at a predetermined point, said spherical mirror being located at said predetermined point.

7. The optical system defined in claim 1, rays parallel to the optical axis of the optical system and entering said planar front surface of said lens at said points of zero tangential aberration intersecting the optical axis of said lens behind said lens at a predetermined intersection point, said spherical mirror being located coincident with said predetermined intersection point.

8. The optical system defined in claim 1, the system further including a Rowland grating provided on the surface of said concave spherical mirror.

9. The optical system defined in claim 1, further including means for injecting light to be difracted into said flat front surface of said lens through point on said locus of points of zero tangential aberration.

10. An optical system of substantially unit power comprising, in combination, a concave spherical mirror having a center of curvature; a lens having a spherical back surface concentric with said spherical mirror and a planar front surface located intermediate said spherical back surface and said center of curvature; and a prism having planar entrance and exit faces one of which adjoins said planar front surface of said lens, said prism having an inclined reflecting face inclined relative to the optical axis of said lens and relative to said planar front surface of said lens, the direction of inclination of said inclined reflecting face being such that points thereon of increasing distance from the optical axis of said lens are of increasing distance from said planar front surface of said lens, said inclined reflecting face having an inner edge located at most slightly spaced from said planar front surface of said lens and at most slightly spaced from the optical axis of said lens, the dimensions of and the angles included by said faces of said prism being such that the travel distance through said prism from the entrance to the exit face thereof for rays passing through said planar front surface of said lens parallel to the optical axis is equal to the distance along the optical axis from said center of curvature to said planar front surface of said lens.

11. The optical system defined in claim 10, said concave spherical mirror being located coincident with the back focal point of said lens.

12. The optical system defined in claim 11, said concave spherical mirror being located intermediate said spherical back surface of said lens and the back focal point of said lens and being spaced from said back focal point a distance equal to at least 1% of the radius of said spherical back surface of said lens.

13. The optical system defined in claim 10, said prism constituting a first prism; further including a second prism having planar entrance and exit faces of which one adjoins said planar front surface of said lens and an inclined reflecting face, said inclined reflecting face of said second prism being inclined relative to the optical axis of said lens and relative to said planar front surface of said lens, said inclined reflecting faces of said first and second prisms being located at opposite sides of the optical axis of said lens, the direction of inclination of said inclined reflecting face of said second prism being such that points thereon of increasing distance from the optical axis of said lens are of increasing distance from said planar front surface of said lens, said inclined reflecting face of said second prism having an inner edge located at most slightly spaced from said planar front surface of said lens and at most slightly spaced from the optical axis of said lens, the dimensions of and the angles included by said faces of said second prism being such that the travel distance through said second prism from the entrance to the exit face thereof for rays passing through said planar front surface of said lens parallel to the optical axis is equal to the distance along the optical axis from said center of curvature to said planar front surface of said lens.

14. The optical system defined in claim 13, further including means for moving an original to be copied across the entrance face of one of said prisms in a predetermined direction at a predetermined speed and for moving material on which the copy is to be formed across the exit face of the other of said prisms in the same direction and at the same speed.

15. The optical system defined in claim 13, wherein said first and second prisms are of identical dimensions.

16. The optical system defined in claim 10, wherein said inner edge of said inclined reflecting face of said prism lies on said planar front surface of said lens and intersects the optical axis of said lens.

17. The optical system defined in claim 13, wherein each of said inner edges of said prisms lies on said planar front surface of said lens and intersects the optical axis of said lens.

18. The optical system defined in claim 10, wherein said inclined reflecting face of said prism includes angles of 45° with said entrance and exit faces of said prism, and wherein said entrance and exit faces of said prism are perpendicular to each other.

19. The optical system defined in claim 10, said inclined reflecting face of said lens being rectangular and having a width less than 1/5 of its length.

20. The optical system defined in claim 10, said prism being a four-sided prism including a fourth face in addition to said entrance, exit and inclined reflecting faces, said fourth face being parallel to the one of said entrance and exit faces which adjoins said planar front surface of said lens, said inclined reflecting face of said prism being rectangular and having a width less than 1/5 of its length.

21. The optical system defined in claim 13, each of said prisms being a four-sided prism including a fourth face in addition to said entrance, exit and inclined reflecting faces, said fourth face of each prism being parallel to the one of said entrance and exit faces which adjoins said planar front surface of said lens, said inclined reflecting face of each prism being rectangular and having a width less than 1/5 of its length.

22. The optical system defined in claim 10, said lens being a doublet lens comprised of a plano-convex first component lens having a planar front surface and a spherical back surface and a second component lens having a spherical front surface and a spherical back surface, all of said spherical surfaces being concentric, the dimensions, dispersion and refractive index of said second component lens being such as to correct for the spherical aberration of the combination of said prism and said first component lens.

23. The optical system defined in claim 22, the combination of said prism and said doublet lens having a back focal point, said spherical mirror being located intermediate said back spherical surface of said doublet lens and said back focal point, said spherical mirror being spaced from said back focal point a distance equal to at least 1% of the radius of said back spherical surface of said doublet lens.

24. The optical system defined in claim 10, said lens being a triplet lens constituted by a first, a second and a third component lens, said first component lens having a planar front surface and a spherical back surface, said second and third component lenses both having spherical front surfaces and spherical back surfaces, all of said spherical surfaces being concentric, the refractive indices, the dispersions and the radii of the spherical surfaces of said first, second and third component lenses being so interrelated that said second and third component lenses correct the spherical aberration and the chromatic aberration of the combination of said prism and said first component lens and produce behind said triplet lens a spherically and chromatically corrected focal point, said concave spherical mirror being located coincident with said spherically and chromatically corrected focal point.

25. A self-conjugate optical system of substantially unit-power comprising, in combination, a triplet lens comprised of a first, a second and a third component lens, said first component lens having a planar front surface and a spherical back surface, said second and third component lenses both having spherical front surfaces and spherical back surfaces, all of said spherical surfaces being concentric, said planar front surface of said first component lens coinciding with the common center of curvature of said concentric spherical surfaces, the refractive indices, the dispersions and the radii of the spherical surfaces of said first, second and third component lenses being so interrelated that said second and third component lenses correct the spherical aberration and the chromatic aberration of said first component lens and produce behind said triplet lens a spherically and chromatically corrected focal point; and a concave spherical mirror concentric with said spherical surfaces and located coincident with said spherically and chromatically corrected focal point.

26. A self-conjugate optical system of substantially unit power comprising, in combination, a concave spherical mirror having a center of curvature; and a lens having a planar front surface coincident with said center of curvature and coincident with the image and object planes of the self-conjugate optical system and a spherical back surface intermediate said spherical mirror and said center of curvature and concentric with said spherical mirror, said spherical back surface and said spherical mirror being spaced apart a distance producing at said planar front face a tangential aberration which is zero at the optical axis of said lens, increases with increasing distance from the optical axis but then decreases with further increasing distance from the optical axis.

27. The optical system defined in claim 26, said lens having a back focal point, said distance between said spherical back surface and said spherical mirror being such that said spherical mirror is offset from said back focal point of said lens by a distance equal to at least 1% of the radius of said spherical back surface of said lens.

* * * * *